US012652057B1

(12) United States Patent
Cassidy et al.

(10) Patent No.: US 12,652,057 B1
(45) Date of Patent: Jun. 9, 2026

(54) SMALL SIGNAL ANALOG INPUT SLOT CARD

(71) Applicant: Digital Dynamics, Inc., Scotts Valley, CA (US)

(72) Inventors: Andrew N Cassidy, Scotts Valley, CA (US); Curtis Nelson, Atascadero, CA (US); Ingemar Gustafson, Scotts Valley, CA (US); Gary Daniel, San Jose, CA (US); Shaun Tomaszewski, Scotts Valley, CA (US); Nicholas Wood, Sunnyvale, CA (US); Richard Casler, Santa Clara, CA (US)

(73) Assignee: Digital Dynamics, Inc., Scotts Valley, CA (US)

( * ) Notice: Subject to any disclaimer, the term of this patent is extended or adjusted under 35 U.S.C. 154(b) by 170 days.

(21) Appl. No.: 18/752,013

(22) Filed: Jun. 24, 2024

Related U.S. Application Data

(60) Provisional application No. 63/461,532, filed on Apr. 24, 2023.

(51) Int. Cl.
| | |
|---|---|
| *H03M 1/10* | (2006.01) |
| *H03M 1/06* | (2006.01) |
| *H03M 1/12* | (2006.01) |

(52) U.S. Cl.
CPC ....... *H03M 1/1071* (2013.01); *H03M 1/0626* (2013.01); *H03M 1/12* (2013.01)

(58) Field of Classification Search
CPC ..... H03M 1/1071; H03M 1/0626; H03M 1/12
See application file for complete search history.

(56) References Cited

FOREIGN PATENT DOCUMENTS

WO      WO-2010147913 A1 * 12/2010   ............. A61B 5/377

* cited by examiner

*Primary Examiner* — Joseph J Lauture
(74) *Attorney, Agent, or Firm* — Edward B. Weller

(57) ABSTRACT

An interface system comprises an analog-to-digital converter and a logic circuit. The analog-to-digital converter includes an input coupled to an input terminal to receive an analog signal and includes an output to provide a digital signal in response to the analog signal. The logic circuit includes an input coupled to the output of the analog-to-digital converter and performs a signal integrity test on the digital signal. The logic circuit includes a first output to provide a first data signal to a first communication line in response to the digital signal and includes a second output to provide a second data signal to a second communication line in response to the digital signal. In one embodiment, the second communication line is a redundant line to the first communication line.

20 Claims, 14 Drawing Sheets

100

200

2x Thermocouples

300

2-wire RTD 3-wire RTD 4-wire RTD

102

700

800

900

1300

| Payload Configuration | Sample Rate (Samples per Second) |
|---|---|
| 8x Thermocouple | 250 |
| 4x RTD | 1000/3 |
| N RTD and M TC where M+N = 4 | 1000/3 |

| Measurement Type | Description |
| --- | --- |
| TC1 | A TC voltage measurement is made on ADC channel 1 |
| TC2 | A TC voltage measurement is made on ADC channel 2 |
| RES_TC1 | A TC resistance measurement is made on ADC channel 1. An ADC internal 1uA current source is driven through the TC and the resulting voltage across the TC is measured. |
| RES_TC2 | A TC resistance measurement is made on ADC channel 1. An ADC internal 1uA current source is driven through the TC and the resulting voltage across the TC is measured.<br><br>Note: if a particular slot is configured as RES_TC1 or RES_TC2, the FPGA automatically swaps back and forth between a RES_TC1 or RES_TC2 slot on successive samples. Therefore the TC resistance measurement sample rate is equal to ½ the full sample rate. The allows only one slot to be used for TC resistance measurements. |
| RTD2 | A 2-wire RTD resistance measurement is made |
| RTD3 | A 3-wire RTD resistance measurement is made |
| RTD3_SWAP | A 3-wire RTD resistance measurement is made, but the test current is driven in reverse of the RTD3 slot. This measurement is used to null offset error between the ADC's IDAC RTD current sources. |
| RTD4 | A 4-wire RTD resistance measurement is made |
| SELF_TEST | The ADC configured to perform a loopback test with the external DAC |

Figure 14

SMALL SIGNAL ANALOG INPUT SLOT CARD

RELATED APPLICATION

This application claims the benefit under 35 USC § 119 to U.S. provisional patent application Ser. No. 63/461,532 filed on Apr. 24, 2023, which is incorporated by reference herein in its entirety.

BACKGROUND

The disclosure relates to analog cards, and, in particular, to small signal analog input slot card.

Unless otherwise indicated herein, the approaches described in this section are not admitted to be prior art by inclusion in this section.

Fabrication systems, such as semiconductor fabrication systems, use numerous sensors to detect parameters and provide analog signals of the detected parameters to processors to control the systems. As these systems change, detections systems are desired that account for these system changes.

What is needed is a system and method for a small signal analog input slot card.

SUMMARY

The present disclosure provides for a small signal analog input slot card. In one embodiment, the disclosure provides for an interface system that comprises an analog-to-digital converter and a logic circuit. The analog-to-digital converter includes an input coupled to an input terminal to receive an analog signal and includes an output to provide a digital signal in response to the analog signal. The logic circuit includes an input coupled to the output of the analog-to-digital converter and performs a signal integrity test on the digital signal. The logic circuit includes a first output to provide a first data signal to a first communication line in response to the digital signal and includes a second output to provide a second data signal to a second communication line in response to the digital signal. In one embodiment, the second communication line is a redundant line to the first communication line.

In one embodiment, the analog signals are small signals.

In one embodiment, the small signals are in the range of +/−2.048 volts.

In one embodiment, the analog signals are large signals.

In one embodiment, the large signals are configurable for the range of +/−10 volts.

In one embodiment, the large signals are configurable for the range of 0 volts to 10 volts.

In one embodiment, the analog signals are large signals having a current in the range of 4 milliamps to 20 milliamps.

In one embodiment, the interface system further comprises a filter coupled between the input terminal and the input of the analog-to-digital converter.

In one embodiment, the interface system further comprises a first local memory and a second local memory. The logic circuit receives calibration data and stores the calibration data in the first and second local memories in a calibration mode and compares the digital signal to the stored calibration data in the first and second local memories in an operation mode.

In one embodiment, in the calibration mode, the logic circuit receives redundant calibration data, compares the redundant data to each other, stores the calibration data in third and fourth local memories if the redundant data matches, and generates an error message if the redundant data does not match.

In one embodiment, the logic circuit is a field programmable gate array.

In one embodiment, the logic circuit is an application-specific integrated circuit.

In one embodiment, the logic circuit is a controller.

In one embodiment, the analog signal is received from a thermocouple.

In one embodiment, the analog signal is received from a resistance temperature detector.

In one embodiment, the first and second communication lines are coupled to first and second field programmable gate arrays, respectively, in an interface module.

In one embodiment, the signal integrity test includes detection of an input short-circuit.

In one embodiment, the signal integrity test includes detection of an input open-circuit.

In one embodiment, the logic circuit performs a voltage regulation test on the analog-to-digital converter.

In one embodiment, the logic circuit performs an analog to digital (A/D) conversion integrity test on the analog-to-digital converter using a programmable reference signal.

In one embodiment, the interface system further comprises a digital-to-analog converter to provide the programmable reference signal.

In one embodiment, the signal integrity test includes over-voltage threshold fault detection.

In one embodiment, the logic circuit validates the over-voltage threshold fault detection using a coherence time.

In one embodiment, the signal integrity test includes under-voltage threshold fault detection.

In one embodiment, the logic circuit validates the under-voltage threshold fault detection using a coherence time.

In one embodiment, the logic circuit is configured to include a configurable notch filter to receive the digital signal, a configurable low pass filter to receive the notch filtered signal, a window detector to compare the low pass filtered signal to at least one threshold and to a coherence signal.

In one embodiment, the logic circuit is configured to include an open and short circuit detector.

In one embodiment, the logic circuit is configured to include a cyclic redundancy check generator.

In one embodiment, the logic circuit provides the first and second data signals for temperature control of an external system.

In one embodiment, the external system is a semiconductor fabrication system.

In one embodiment, the first and second data signals comply with SIL-3 under IEC61508.

The disclosure provides methods for performing the processes described herein.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

FIG. 13 is a diagram illustrating sensor types according to one embodiment.

FIG. 14 is a diagram illustrating a table of measurement types according to one embodiment.

DETAILED DESCRIPTION

Various embodiments of the present invention are now described with reference to the figures where like reference numbers indicate identical or functionally similar elements. Also in the figures, the left most digits of each reference number corresponds to the figure in which the reference number is first used.

Reference in the specification to "one embodiment", "an embodiment", "various embodiments" or "some embodiments" means that a particular feature, structure, or characteristic described in connection with these embodiments is included in at least one embodiment of the invention, and such references in various places in the specification are not necessarily all referring to the same embodiment.

The disclosure provides for a small signal analog input module or slot card that interfaces with an external or remote interface module that interfaces with other external electronics or systems. In various embodiments, the slot card provides a plurality of channels (e.g., 8 channels) of accurate (e.g., Safety Integrity Level (SIL)-3 under IEC61508) temperature measurements. In some embodiments, the slot card makes temperature measurements by interfacing either to an external thermocouple (TC) or resistance temperature detector (RTD).

Figure 1:
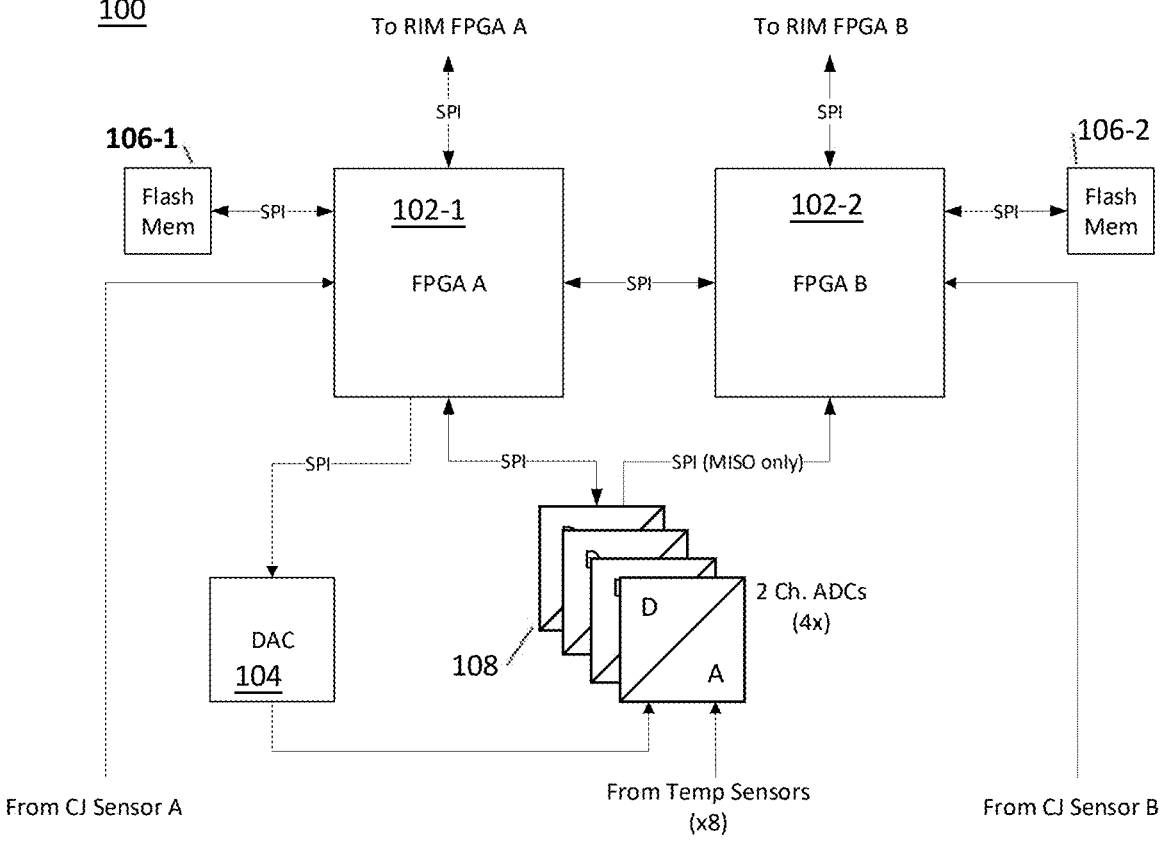
FIG. 1 is a block diagram illustrating small signal analog input slot card according to one embodiment.

FIG. 1 is a block diagram illustrating small signal analog input slot card 100 according to one embodiment. The slot card 100 comprises a plurality of FPGAs 102 (e.g., two 102-1 and 102-2), a digital-to-analog converter (DAC) 104, a plurality of memories 106 (e.g., flash memories 106-1 and 106-2) and a plurality of digital-to-analog converters (ADCs) 108. In one embodiment, each ADC 108 is a two channel ADC. The ADCs receive signals from sensors, such as temperature sensors. The ADCs may be, for example, part number ADS 124S0X ADCs by Texas Instruments.

The slot cad 100 may be configured for different types of measurement devices.

FIG. 13 is a diagram 1300 illustrating sensor types according to one embodiment. The sensory types may be, for example, thermocouples, RTDs, N-RTD and M-TC thermocouples. As an illustrative example, the sum of the numbers N and M (M+N) is 4. In one embodiment, the slot card 100 can perform up to 8 temperature measurements in parallel. The table of diagram 1300 summarizes various channel configurations and their corresponding sample rates.

Figure 2:
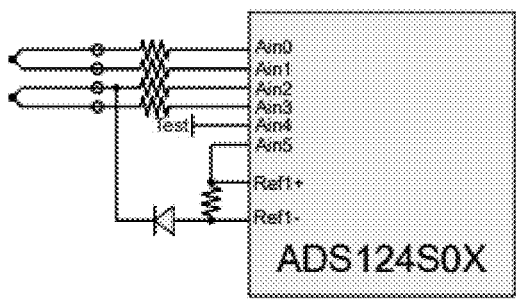
FIG. 2 is a block diagram illustrating a thermocouple interface according to one embodiment.

Referring now to FIG. 2, the thermocouples are next described.

FIG. 2 is a block diagram illustrating a thermocouple interface 200 according to one embodiment. In various embodiments, thermocouple type is per-channel configurable. The types may be, for example, B, E, J, K, N, R, S, T. The thermocouples are connected to either AIN0 and AIN1 or AIN2 and AIN3 on a particular ADC 108. In one embodiment, thermocouples are connected to the ADC 108 as shown in FIG. 2.

Figure 3:
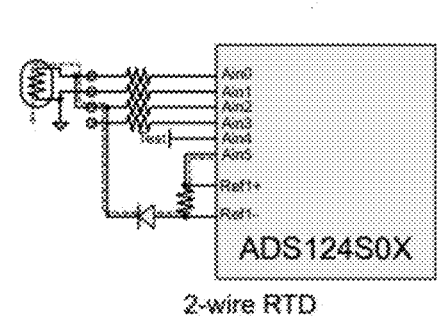
FIG. 3 is a block diagram illustrating a resistance temperature detector (RTD) interface according to one embodiment.
Figure 3:
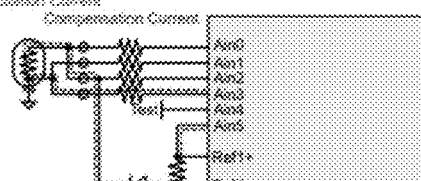
Figure 3:
Figure 3:
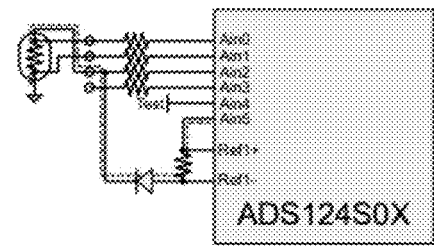

Referring now to FIG. 3, various resistance temperature detectors are next described.

FIG. 3 is a block diagram illustrating a resistance temperature detector (RTD) interface 300 according to one embodiment. FIG. 3 illustrates 2, 3 and 4 wire RTDs which are supported by the slot module 100. The RTD element type is per channel configurable. The element types may be, for example, PT100 or PT1000. The RTDs are connected to an ADC 108 as shown in FIG. 3.

Referring again to FIG. 1, the digital data path is next described.

Once measurements are digitized inside the ADCs 108, data are transferred into the FPGAs 102, which, in some embodiments, are dual redundant FPGAs 102. The remainder of the digital data path is implemented within the FPGAs 102. The FPGAs function as an interface between the analog front end electronics of the slot card 100 and FPGAs of a remote interface module (RIM) FPGAs (described below in conjunction with FIG. 6). The FPGAs 102 contain several data processing features, which are discussed further below.

It is of note that both FPGAs 102-1 and 102-2 are programmed with the same bitstream, but wiring on the printed circuit board (PCB) (not shown) uses only control outputs of FPGA 102-1 to communicate with onboard peripherals, such as ADCs 108. Both FPGA 102-1 and 102-2 have identical input connections; therefore, both FPGAs receive the same digitized data from each ADC 108.

Various features of the FPGAs 102 are next described

The synchronization of the slow card 100 is next described. The effective sample rate of the slot card may be, for example, 250 Hz when 8 thermocouples are connected. It is 1000/3 Hz in all other cases. ADC conversions are initialized, and measurement data are updated in sync with a precommit trigger that the slot card 100 receives from the RIM (not shown). This ensures that measurement data changes on the same EtherCat frame across all channels. Note, however, that data are not simultaneously sampled across all channels.

An illustrative measurement sequence is next described.

FIG. 14 is a diagram illustrating a table 1400 of measurement types according to one embodiment. Because all possible measurement types are not made in parallel, repetitive measurements are made sequentially. The slice of time allocated for a particular measurement is called a slot. Each slot can be configured, via the .dcf file, to make any of the measurement types summarized in FIG. 14.

Figure 4:
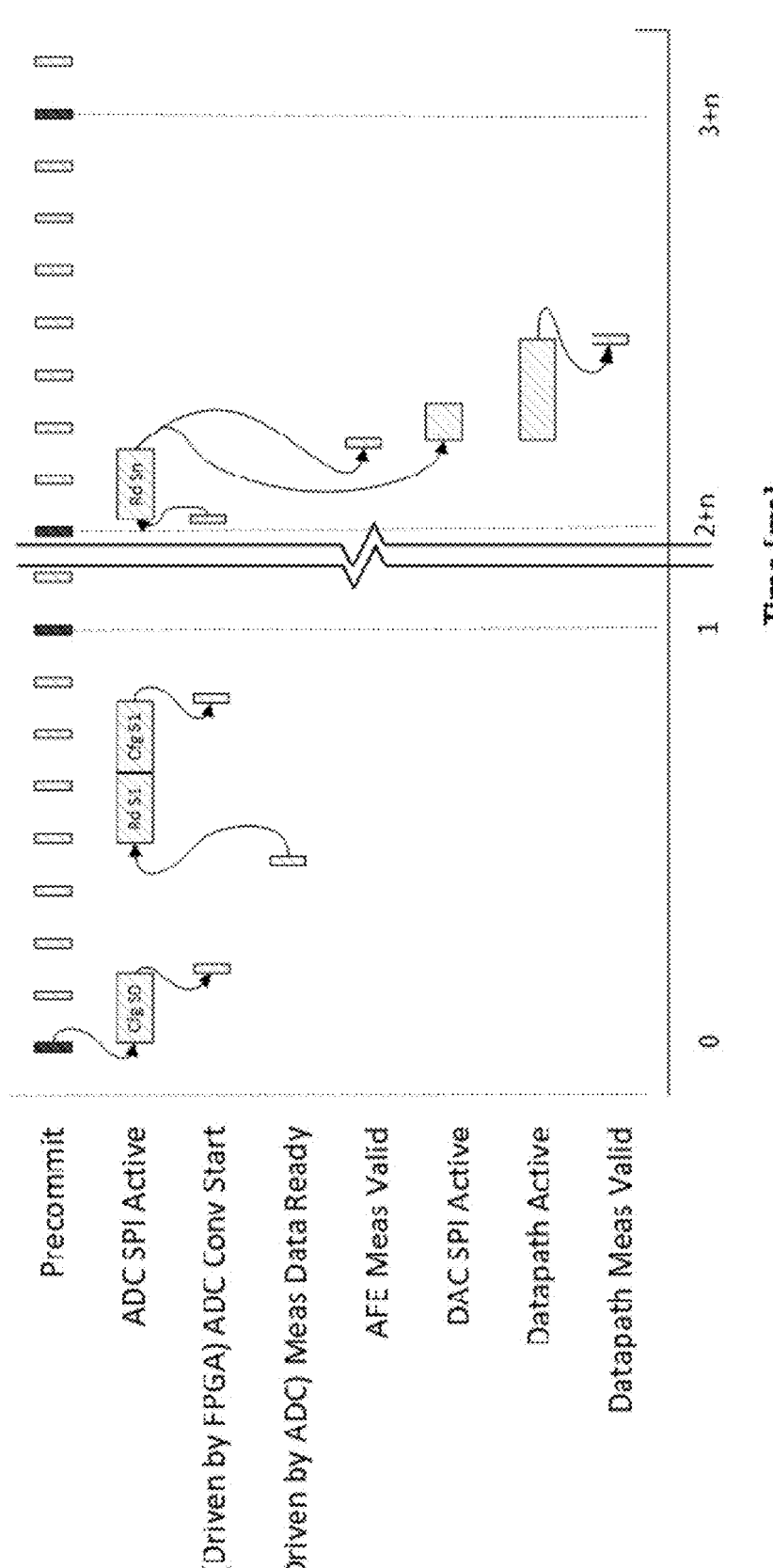
FIG. 4 is a timing diagram of a measurement sequence according to one embodiment.

Refer now to FIG. 4. An illustrative timing sequence is next described.

FIG. 4 is a timing diagram of a measurement sequence 400 according to one embodiment. The slot schedule for each ADC 108 can be configured independently. The FPGA 102-1 is the master of the slot sequence, as it writes configuration registers within each ADC 108 at the beginning of each slot, initiates conversions in each ADC 108. Both FPGAs 102 poll each ADC 108 for "meas data ready", then retrieve the measurement data. Four slot schedules always run at 250 Hz sample rate, and three slot schedules always run at 1000/3 Hz sample. No other schedule length options are allowed. FIG. 4 shows the measurement sequence for both the 250 Hz and 1000/3 Hz cases.

The following is noted about FIG. 4:

The relative timing of signals in the above diagrams are not to scale, other than the precommit pulses.

Precommit pulses marked in red indicate a 200 ns duration precommit trigger, as opposed to the normal 100 ns.

For Fsample=250 Hz, n=0. For Fsample=1000/3 Hz, n=1.

The FPGA 102 is next described.

Figure 5:
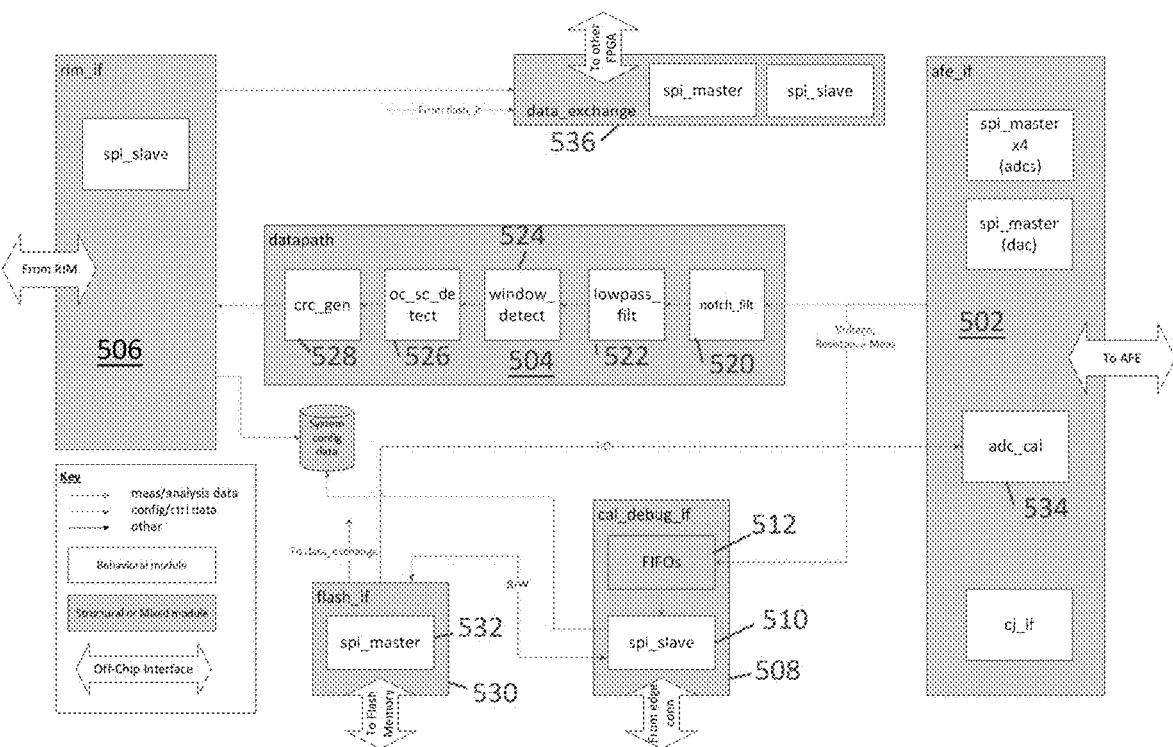
FIG. 5 is a block diagram illustrating field programmable gate arrays (FPGAs) according to one embodiment.

FIG. 5 is a block diagram illustrating the field programmable gate array (FPGA) 102 according to one embodiment.

The FPGA 102 has a plurality of interfaces.

SPI master to ADCs (×4): Used for acquiring data and configuring the ADC.

SPI master to DAC: Used for sending data and configuring the DAC.

SPI masters to flash memory: Used for writing calibration data during slot card calibration. Used for reading calibration data during normal operation. Two independent SPI bus masters are connected to redundant memories.

SPI slaves from RIM FPGAs: Used for receiving configuration data and for sending measurement data. There is one SPI bus coming from each RIM FPGA; the same data are sent to both RIM FPGAs and the same data are expected to be received from each RIM FPGA.

SPI slave from the edge connector: Used for writing and reading back calibration data to/from flash memory. Also used for debug and development purposes.

The FPGA 102 comprises an analog front end interface (afe_if) 502 is responsible for configuring and sequencing all analog front end external peripherals, including the ADCs 108, the DAC 104, and, in some embodiments, a cold junction sensor (not shown). The analog front end interface 502 retrieves measurement data from the ADCs 108, applies cold junction correction (if applicable), then packs the data into an 8-channel stream, which is output to a datapath module 504 for further signal processing.

Cold junction sensors are not resident on the slot card 102; however, the cold junction sensors are interfaced to the slot card FPGAs 102 via a RIM interface connector 506. Each FPGA 102 has its own cold junction sensor. Cold junction correction occurs within the FPGA 102 by executing the following steps, in order:

Capture the cold junction measurement, which is given in degrees C.;

Convert from degrees C. to volts, taking the type of connected thermocouple into account;

This is achieved by doing a 9th order polynomial interpolation in the floating point domain. For example, using NIST's ITS-90 tables for the polynomials that were used.

Subtract the cold junction voltage calculated in the second step 2 above from the ADC's digitized voltage measurement.

The analog front end interface 502 is also responsible for configuring calibration offset and slope values, which it receives from a flash interface 508. The interface 502 also handles this function because calibrations are applied within each ADC 108, and the slope and offset values are written to an ADC register (not shown) in order to enable this ADC 108 feature.

Lastly, the ADC 108 makes a determination as to the pass/fail status of each ADC's self-test. It does so by comparing an ADC measurement with a DAC set point. The self test is described in further detail below.

The FGPA 102 further comprises a calibration data interface (cal_debut_if) 508 that receives calibration data directly from an SPI slave interface 510 that is wired to the slot card's edge connector. Logic within the module 508 implements a memory mapped interface 512 that can be used to access various other FPGA modules for debug and development purposes, in addition to the flash memory interface. Specifically, the module 508 expects 96-bit SPI transactions with the following data field layout:

Bit 95-Write ('1') or Read ('0')

Bit 94-FPGA B ('1') or FPGA A ('0')

Bits 93 downto 67—Address

Bits 66 downto 64—Unused, always set to '1'

Bits 63 downto 0—Data

As it pertains to calibration data, the following data is written to the flash memory 104 in the ordering as follows:

Calibration software version (4 bytes)

Calibration datecode (4 bytes)

Voltage calibration offsets, ×8 (4 bytes each)

Voltage calibration slopes, ×8 (4 bytes each)

Resistance calibration offsets, ×8 (4 bytes each)

Resistance calibration slopes, ×8 (4 bytes each)

Calibration data are read once at startup and stored locally within FPGA distributed RAM. If the FPGA 102 detects that the flash memory's calibration datecode field has not been written since its last erasure, the FPGA 102 defaults to using a calibration slope of 1 and a calibration offset of 0.

The datapath module 504 (datapath) implements the main signal processing blocks for the slot card 102. The module contains 8 parallel 16-bit signal channels. Each channel includes voltage data, and resistance data. Filtering and window detection are performed on voltage data only. By the time each channel leaves the datapath module 504, it also consists of four status bits: open circuit detect, short circuit detect, voltage signal out-of-range low, and voltage signal out-of-range high.

The datapath module 504 comprises a configurable notch filter 520. The notch frequency can be set to 50 Hz, 60 Hz, or the filter 520 can be bypassed. The notch filter 520 is implemented as a 2nd order IIR biquad filter with 16-bit filter taps that have fixed point format 2Q14.

The datapath module 504 further comprises a configurable lowpass filter 522. The 6 dB bandwidth of the filter 522 can be set to 0.5 Hz, 1 Hz, 2.5 Hz, 5 Hz, 10 Hz, 25 Hz, 50 Hz, or the filter 522 can be bypassed. The filter may be implemented as a 2nd order IIR biquad filter with 24-bit filter taps that have fixed point format 2Q22. A digital butterworth filter prototype was used to calculate the filter taps.

The datapath module 504 comprises a window detector 524. After filtering, each voltage signal is compared against two thresholds and against a coherency filter. Specifically, if the signal amplitude is less than the out-of-range low threshold for N measurements, then the out-of-range low error bit is set in the status word. If the signal amplitude is greater than the out-of-range high threshold for N measurements, then the out-of-range high error bit is set in the corresponding channel's status byte. In some embodiments, the number N is the coherency filter setting.

The datapath module 504 also comprises an open and short circuit detector 526. The datapath module 504 uses each channel's resistance measurement to identify short and open circuit conditions. It does so by comparing the resistance measurement against thresholds. The upper threshold used for open circuit detection is an ADC code of 32000, which corresponds to a resistance of 62.5 kohms. The lower threshold used for short circuit detection is an ADC code of 3390, which corresponds to a resistance of 10 ohms.

The datapath module 504 comprises a CRC generator 528 that is described below.

The FPGA 102 comprises a RIM interface (rim_if) 506 that is a bidirectional interface between the slot card FPGA 102 and its counterpart FPGA on the RIM. The interface 506 is implemented as a 10 MHz SPI-like bus. Instead of a chip select, it has separate precommit and commit signals (see section 5.3 for details). The interface module 506 is responsible both for receiving configuration data from the RIM FPGA during initialization and for sending measurement data to the RIM during normal operation.

The FPGA 102 comprises a flash interface (flash_if) 530 that includes logic that converts from the FPGA's internal parallel address/data bus to 12.5 MHz SPI master transactions in a spi_master 532 that are compatible with the W25Q128 flash chip. The flash interface 530 provides read-only flash access to a adc_cal module 534 and read-write access to the cal_debug_if 508. It also provides a means for erasing the flash via the cal_debug_if 508.

The FPGA 102 comprises a data exchange interface (data_exchange) 536 that allows for the two slot card FPGAs 102 to compare both their calibration data received from the flash 106 and their configuration data received from the RIM.

The physical interface used for data exchange is two independent 12.5 MHz unidirectional SPI interfaces.

Figure 6:
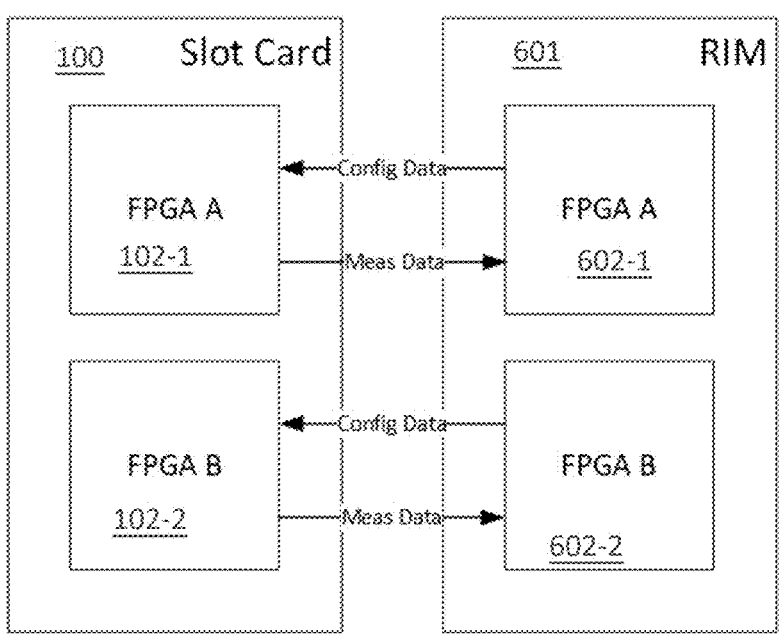
FIG. 6 is a block diagram illustrating data transfer between a slot card and a remote interface module (RIM) according to one embodiment.

Next, the data transfer between the slot card 102 and an external RIM is next described. Generally, the RIM sends configuration data to the slot card 102 and the slot card 102 sends measurement data to the RIM FIG. 6 is a block diagram illustrating data transfer between a slot card and a remote interface module (RIM) according to one embodiment.

A system 600 comprises at least one RIM module 601 and at least one slot card 100. The RIM module 601 comprises first and second FPGAs 602-1 and 602-2 coupled to the FPGAs 102-1 and 102-2, respectively. The following measurement data are transferred cyclically from the slot card 102 to the RIM 601 during card normal operation.

Voltage measurement data. 128 bits total.
8 channels, 16 bits per channel
Status data. 64 bits total.
Channel-specific: 8 channels, 4 bits per channel
Signal out of range low
Signal out of range high
Short-circuit detected
Open-circuit detected
Card-level, 16 bits
Configuration data exchange error
Calibration data read error
ADC self-test error
Card detect (always set to '1')

CRC, 16 bits
CRC of all analog/temperature measurement data and status data

All configuration data bound for the slot card FPGA 102 are received redundantly from the RIM FPGAs 602 just once. The same configuration data are expected to be received on the A channel by the FPGA 102-1 and the B channel by the FPGA 102-2. These data are compared, and an error is generated in the case of a mismatch.

The following configuration data fields are expected:
Voltage measurement out of range high threshold, 16 bits per channel
Voltage measurement out of range low threshold, 16 bits per channel
IIR digital filter coefficients, 5×16 bits per channel
FIR notch filter select, 2 bits per channel
Coherency filter setting, 8 bits per channel
Coherency filter high/low enable, 2 bits per channel
Slot type select, 16 bits per ADC
ADC configuration vectors, 128 bits per slot type
Sample rate select, 1 bit per ADC
Thermocouple type, 3 bits per ADC Slot card FPGAs 102-1 and 102-2 are connected to their RIM counterpart FPGA 602-1 and 602-2 via the usual 10 MHz SPI-like interface bus. The slot card 100 operates with a 64-bit transfer width. The sequence of events is identical for both the A and B FPGAs 102-1 and 102-2.

Figure 7:
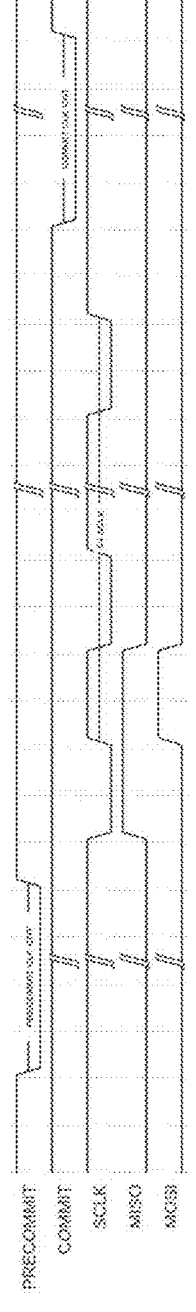
FIG. 7 is a timing diagram illustrating timing between a slot card and a RIM according to one embodiment.

FIG. 7 is a timing diagram 700 illustrating timing between a slot card and a RIM according to one embodiment.

The structure of a RIM to Slot Card transaction is shown in FIG. 7. The sequence of event to complete one transaction includes the following:

The RIM 601 takes PRECOMMIT low for a minimum of PRECOMMIT_CLK_CNT Slot Card FPGA clocks. This activates the Slot Card SPI interface and places the SPI slave controller into a state where it is ready to receive SPI data.

PRECOMMIT pulses with a duration of less than PRECOMMIT_CLK_CNT clocks are ignored by the card and do not advance the internal state machine.

PRECOMMIT pulses longer than PRECOMMIT-_CLK_CNT clocks are accepted up to a maximum of Y clocks before the internal deglitch filter rolls over to a count of 0 clocks.

This is followed by 64 SCLKs.

The Slot Card 102 takes a minimum of 64 SCLKs to advance the internal state machine.

Excess SCLKs are ignored as the SPI port is deactivated after receiving 64 SCLKs.

When the card 102 is being initialized by the RIM 601, configuration data is latched immediately upon completion of the 64th SCLK.

The RIM 601 takes COMMIT low for a minimum of 10 Slot Card FPGA clocks. This advances the internal state machine, and the card becomes ready to receive the next PRECOMMIT pulse.

If the COMMIT pulse is not properly sent, the card 102 will not step through its initialization sequence when being initialized by the RIM 601.

COMMIT pulses with a duration of less than COMMIT-_CLK_CNT clocks are ignored by the card and do not advance the internal state machine.

Figure 8:
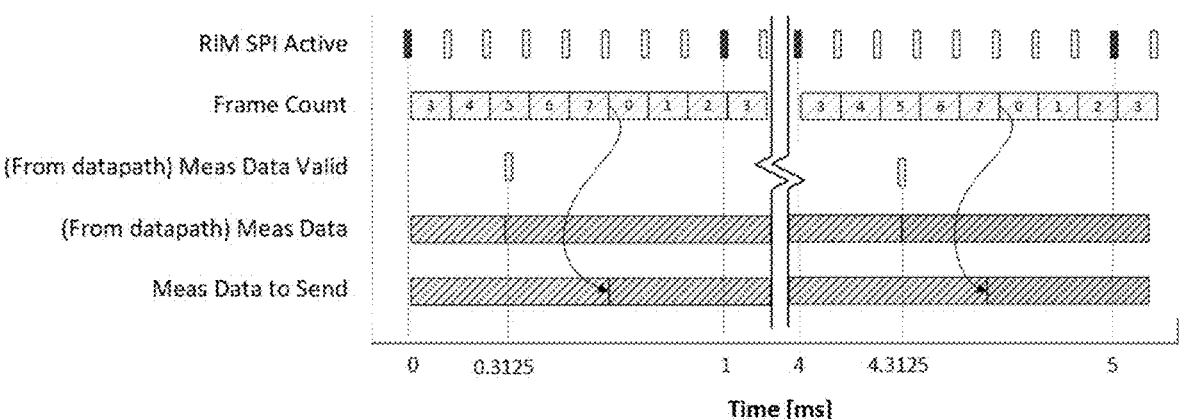
FIG. 8 is a timing diagram illustrating a RIM interface measurement data transfer sequence according to one embodiment.

FIG. 8 is a timing diagram illustrating a RIM interface measurement data transfer sequence according to one embodiment.

The measurement data transfer sequence is now described. In general, different measurement data are transferred to the RIM 601 on each frame index. The frame index is determined by a counter that counts up from 0 and rolls over at 7. The entire 8-channel measurement data set is registered inside the RIM 601 when the frame count is equal to 0. This ensures the coherency of the transferred data. The specific data transferred on each frame is summarized below:

Frame 0—Voltage measurements, Chs. 0-3
Frame 1—Voltage measurements, Chs. 4-7
Frame 2—Resistance measurements, Chs. 0-3
Frame 3—Resistance measurements, Chs. 4-7
Frames 4-7—Digital status data+CRC (same data on all 4 frames)

FIG. 8 shows the measurement data transfer sequence. RIM SPI transfers marked in red indicate transfers accompanied by a 200 ns duration precommit trigger. All other precommit triggers have 100 ns duration. The slot card FPGA 102 uses the 200 ns precommit as a marker to know when to reset its frame index counter to 3.

Figure 9:
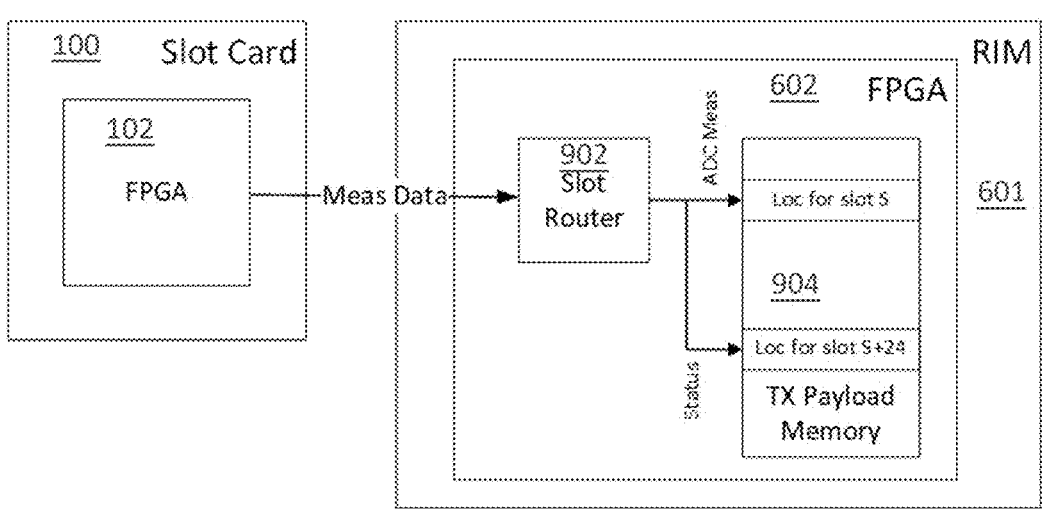
FIG. 9 is a block diagram illustrating data routing for measurement data in the RIM FPGA according to one embodiment.

FIG. 9 is a block diagram illustrating data routing for measurement data in the RIM FPGA 602 according to one embodiment. A system 900 comprises a slot card 100 and a RIM 601. The RIM 601 comprises a slot router 902 and a transmit (TX) payload memory 904.

Internal communication of the RIM FPGA 602 is next described. The RIM FPGA 602 is responsible for separating the AIN status data from the AIN voltage and resistance measurement data. Specifically, the RIM FPGA 602 treats voltage and resistance measurement data as it would normal AIN measurement data (One difference is that AIN data coming from a slot card is sent redundantly on both A and B communication channels. This is done so that the CRC can be validated within the CM (configuration module) FPGA.) The FPGA 602 writes the data to a TX payload buffer memory address specified for the slot with the populated AIN card 100. The FPGA 602 routes status data as if it had come from slot number S+24, where S is the actual populated slot number. This is done so that the CM can receive and handle the status data separately, as if it were DIN data.

The RIM FPGA 602 knows to handle AIN status data as described above whenever it detects a populated slot card with a AIN slot ID.

The RIM FPGA 602 treats configuration data as it would any other data bound for a slot card. It reads the data from the specified location in RX payload buffer memory writes it to the slot card 100. There is no special handling of configuration data within the RIM FPGA 602. It is up to the slot card 100 to ignore incoming data after it has been fully configured.

Figure 10:
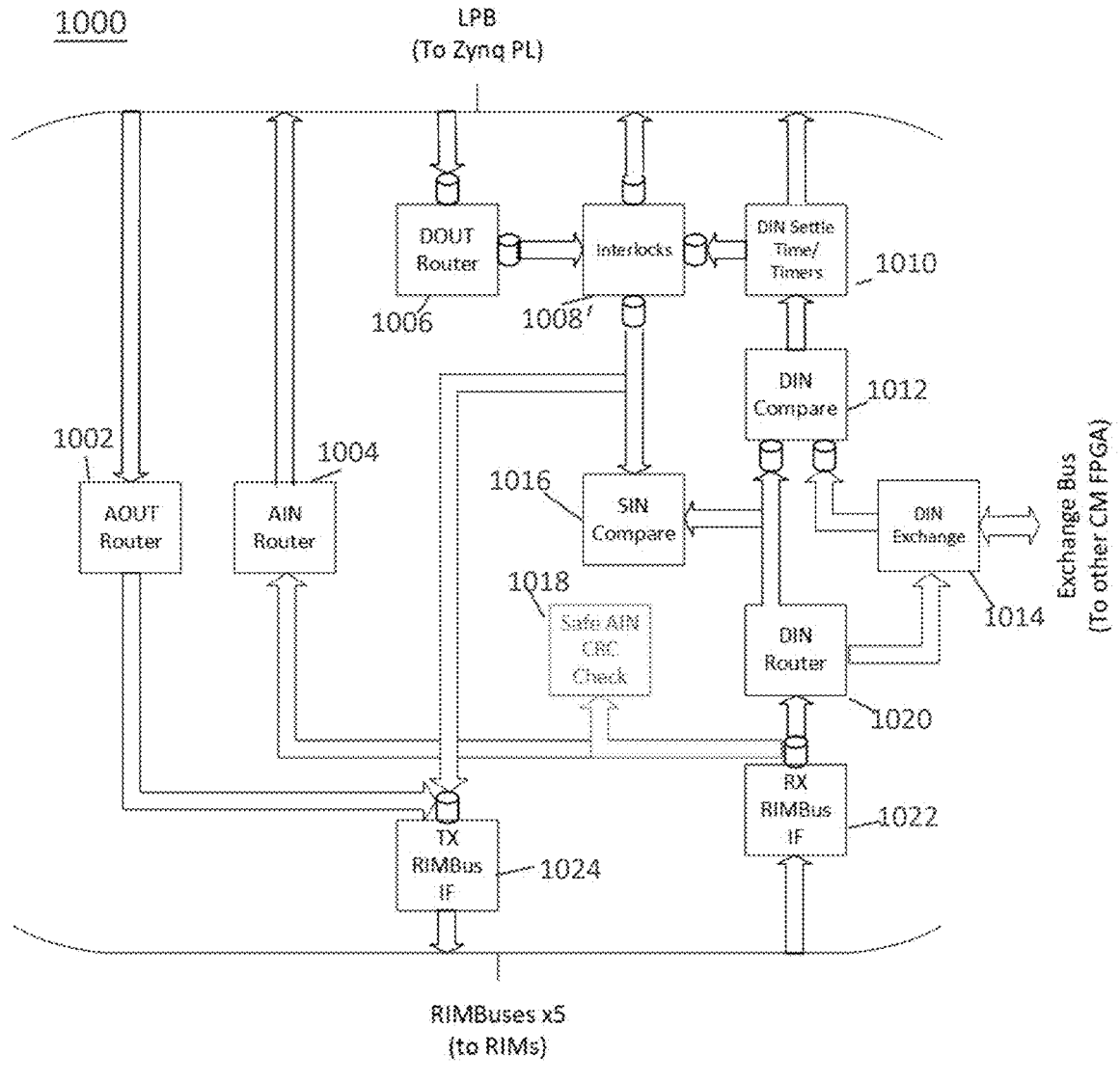
FIG. 10 is a block diagram illustrating a configuration module FPGA according to one embodiment.

FIG. 10 is a block diagram illustrating a configuration module (CM) FPGA 1000 according to one embodiment. The CM FPGA 1000 comprises an analog output (AOUT) router 1002, an analog input (AIN) router 1004, a digital output (DOUT) router 1006, an interlock 1008, a digital input (DIN) settle time timers 1010, a digital input (DIN) comparator 1012, a DIN exchange 1014, a serial input (SIN) comparator 1016, a safe AIN CRC check 1018, a DIN router 1020, a receiver RIM Bus interface 1022, and a transmit RIM Bus interface 1024.

The AIN router 1004 sends AIN voltage measurement data to an external processor (e.g., Zynq) as any other AIN data would be.

The AIN status data are treated as any other digital DIN data would be. So that data is exchanged with the counterpart FPGA, the .dcf file enables each DIN bit in question. Additionally, AIN status data may be used in interlock equations just as any other DIN data can be.

The CM FPGA 1000 continuously sends configuration data in a specified order. The slot card 100 identifies the beginning of the configuration data set by detecting the start word, which is defined in the .dcf file to be 0x12345678abcde.

Figure 11:
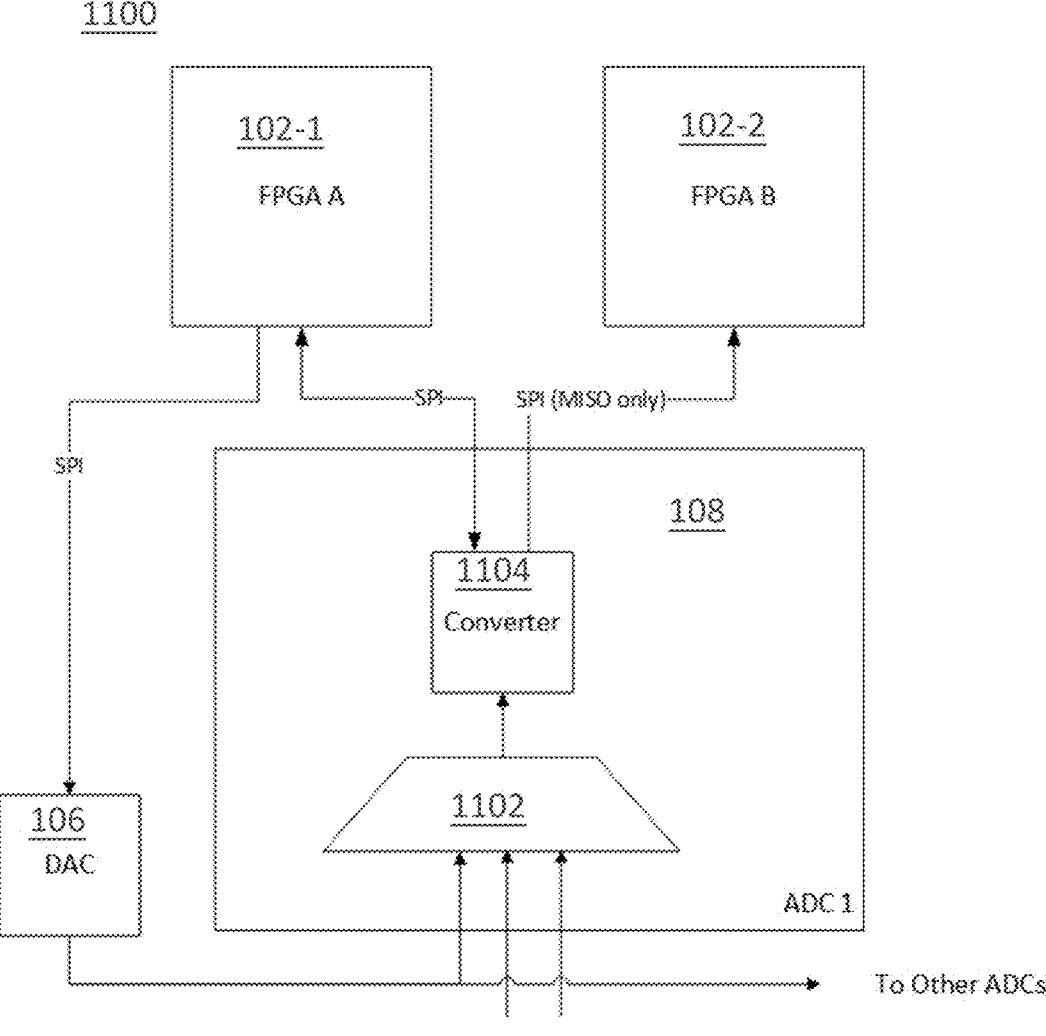
FIG. 11 is a block diagram illustrating an analog-to-digital converter (ADC) self-test hardware configuration according to one embodiment.

FIG. 11 is a block diagram illustrating an analog-to-digital converter (ADC) self-test hardware configuration according to one embodiment.

A slot card 1100, such as the slot card 102, is configured in an ADC self test mode. The slot card 1100 comprises FPGAs 102-1 and 102-2, a DAC 106, and a plurality of ADCs 108. The ADC 108 comprises a multiplexer (MUX) 1102 and an ADC 11104. Each ADC 108 is checked for correct operation at the full sample rate by an on-board digital-to-analog converter (DAC) 106. The DAC output is connected to the 3rd input on each of the 4 ADCs 108 in parallel, as shown in FIG. 11. Just before the self-test conversion, the FPGA A 102-1 sets the DAC output voltage and it to the ADC converters 1104 via a MUX 1102 that is internal to the ADC 108. Both FPGAs 102 read back the conversion and check it against the value that was set. The DAC set point is increased by 250uV on each cycle until it rolls over back to OV when it reaches the maximum voltage level of Vref.

If the checked value deviates from the DAC set point by more than 125uV, then the FPGAs 102 assert one of their digital outputs; thus, the error can be handled upstream by the CM 1000 as needed.

All configuration data received by the FPGAs 102 from the RIM FPGA 602 counterparts during initialization are checked for integrity. The integrity check is done by exchanging all data between FPGA A 102-1 and FPGA B 102-2 and comparing the data bit-by-bit. The physical interface used for exchanging the data consists of two independent unidirectional SPI buses running at 12.5 MHz.

If a mismatch is detected, then the FPGAs 102 assert one of their digital outputs; thus, the error can be handled upstream by the CM 1000 as necessary.

Immediately following the configuration data exchange discussed above, each FPGA 102 reads its calibration data from flash memory and exchanges it on the same physical interface used for configuration data exchange. The data are compared bit-by-bit.

If a mismatch is detected, then the FPGAs 102 assert one of their digital outputs; thus, the error can be handled upstream by the CM 1000 as necessary.

Figure 12:
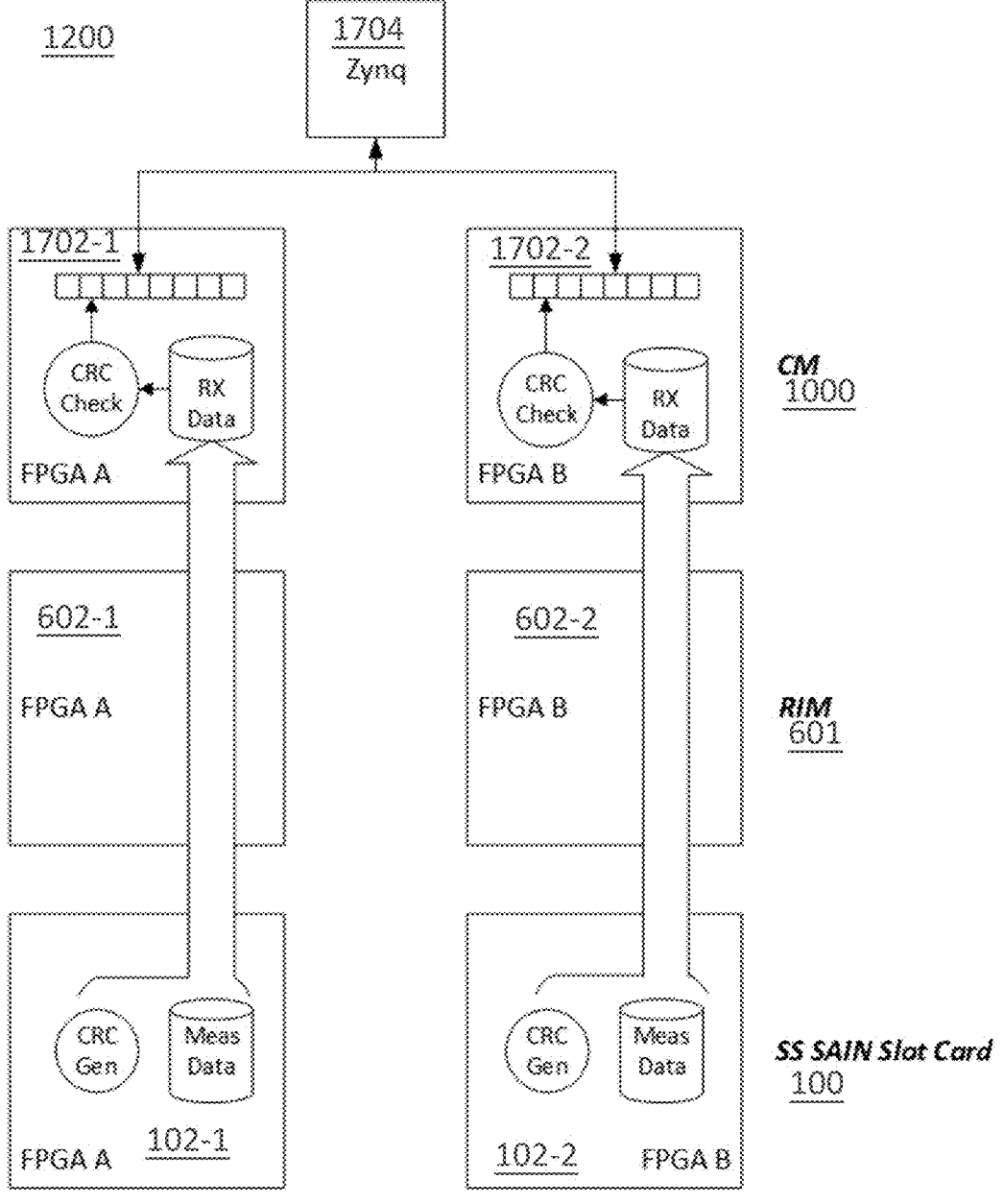
FIG. 12 is a block diagram illustrating measurement data cyclic redundancy check (CRC) check data flow according to one embodiment.

FIG. 12 is a block diagram illustrating measurement data cyclic redundancy check (CRC) check data flow according to one embodiment.

A measurement data system 1200 comprises a slot card 100, a RIM 601 a CM 1000, and a processor 1704. The CM 1000 comprises FPGAs 1702-1 and 1702-2. All data generated by the slot card 102 are sent redundantly, i.e., along the A and B communication paths in parallel. Additionally, the slot card 100 generates a 16-bit CRC word that accompanies each set of generated data. Note that a data set in this context comprises one instance of the data described above When each data set arrives at the CM FPGAs 1702-1 and 1702-2, it checks the measurement data against its associated CRC.

If a CRC mismatch is detected, the CM FPGA 1702 de-asserts a bit in its CRC_OK register (address offset 0x2804), which is monitored by the Zynq processor 1704. The CRC_OK register is 16 bits wide, and the de-asserted bit will correspond to the AIN index defined in the .dcf file for the slot card that generated the error.

Other features are next described.

MakeConfig and .dcf file are described. This section summarizes changes that have been made to the .dcf configuration file format.

AIN Configuration Data Block (0x12000): This memory block has been added in order to define all of the configuration data required to configure AIN slot cards 102. As mentioned previously, the CM FPGA 1702 reads this data at power up and sends it cyclically to the slot card 102 as AOUT data. The memory block contains all of the raw configuration data. The CM FPGA 1702 does not interpret this data; it only passes it directly to AIN slot cards 102. A maximum of 16 configuration data instances (one per AIN slot card 102 in the system) can be stored here.

AIN Mapping Data Block (0x14000): This memory block consists of two sub-blocks that serve the following purposes.

To define a mapping between the RX payload addresses that contain AIN voltage and resistance measurements and the RX payload address that contains the corresponding AIN status data. This mapping is needed in order to perform the CRC check. One mapping entry is needed for each AIN card in the system.

To define a mapping between the AOUT index number used for sending AIN configuration data and the configuration data set to be sent. One mapping entry is used for each AIN card 100 in the system.

AIN Routing Block-0xE000: All AIN voltage and resistance measurement data bound for the EtherCat slave controller is enabled within this block. Additionally, the configuration enables the sending of all measurement data redundantly across the A and B data paths to ensure integrity. The frame and mask values are set such that frames 0 through 3 contain voltage and resistance data, and the sending of measurements repeat once per 8 frame set.

AOUT Routing Block-0x7000: The AOUT routing block enables the AOUT channels used for transmission of AIN configuration data.

DI Routing Block-0x6000: All AIN status bits bound for the EtherCat slave controller are enabled within this block. The configuration enables the sending of all status data redundantly to ensure integrity.

Interlock Block-0x0000: Any AIN status data may be included as part of an interlock equation should be configured within this block.

RIM Routing/Address Table-0xB000: Appropriate TX and RX payload addresses are chosen for AIN configuration data, AIN analog/temperature measurement data, and AIN status data. As noted in section 5.4, RIMs will automatically write status data to the occupied slot number+24. The .dcf file takes this into account.

CRC Block-0xD000: The CRC block may include both the AIN Configuration Data Block and the AIN Mapping Data Block.

In some embodiments, a maximum number of AIN cards 100 per RIM 601 may be determined based on spare slots in each RI 601.

To the extent that section headings are used, they should not be construed as necessarily limiting.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. Also, as used in the description herein and throughout the claims that follow, the meaning of "on" includes "in" and "on" unless the context clearly dictates otherwise.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. An interface system comprising:
an analog-to-digital converter including an input coupled to an input terminal to receive an analog signal and including an output to provide a digital signal in response to the analog signal; and
a logic circuit including an input coupled to the output of the analog-to-digital converter and performs a signal integrity test on the digital signal, the logic circuit including a first output to provide a first data signal to a first communication line in response to the digital signal and having a second output to provide a second data signal to a second communication line in response to the digital signal, the second communication line being a redundant line to the first communication line.

2. The interface system of claim 1, wherein the analog signals are small signals.

3. The interface system of claim 1, wherein the analog signals are large signals.

4. The interface system of claim 1, further comprising a filter coupled between the input terminal and the input of the analog-to-digital converter.

5. The interface system of claim 1, further comprising a first local memory and a second local memory, wherein the logic circuit receives calibration data and stores the calibration data in the first and second local memories in a calibration mode and compares the digital signal to the stored calibration data in the first and second local memories in an operation mode.

6. The interface system of claim 5, wherein, in the calibration mode, the logic circuit receives redundant calibration data, compares the redundant data to each other, stores the calibration data in third and fourth local memories if the redundant data matches, and generates an error message if the redundant data does not match.

7. The interface system of claim 1, wherein the analog signal is received from a thermocouple.

8. The interface system of claim 1, wherein the analog signal is received from a resistance temperature detector.

9. The interface system of claim 1, wherein the first and second communication lines are coupled to first and second field programmable gate arrays (FPGAs), respectively, in an interface module.

10. The interface system of claim 1, wherein the signal integrity test includes detection of an input short-circuit.

11. The interface system of claim 1, wherein the signal integrity test includes detection of an input open-circuit.

12. The interface system of claim 1, wherein the logic circuit performs a voltage regulation test on the analog-to-digital converter.

13. The interface system of claim 1, wherein the logic circuit performs an A/D conversion integrity test on the analog-to-digital converter using a programmable reference signal.

14. The interface system of claim 13, further comprising a digital-to-analog converter to provide the programmable reference signal.

15. The interface system of claim 1, wherein the signal integrity test includes over-voltage threshold fault detection, wherein the signal integrity test includes under-voltage threshold fault detection.

16. The interface system of claim 15, wherein the logic circuit validates the over-voltage threshold fault detection using a coherence time, wherein the logic circuit validates the under-voltage threshold fault detection using a coherence time.

17. The interface system of claim 1, wherein the logic circuit is configured to include a configurable notch filter to receive the digital signal, a configurable low pass filter to receive the notch filtered signal, a window detector to compare the low pass filtered signal to at least one threshold and to a coherence signal.

18. The interface system of claim 1, wherein the logic circuit is configured to include an open and short circuit detector.

19. The interface system of claim 1, wherein the logic circuit is configured to include a cyclic redundancy check generator.

20. The interface system of claim 1, wherein the logic circuit provides the first and second data signals for temperature control of an external system.

* * * * *